(12) United States Patent
Nishimura et al.

(10) Patent No.: US 8,054,588 B2
(45) Date of Patent: Nov. 8, 2011

(54) TUNNELING MAGNETORESISTIVE ELEMENT INCLUDING MULTILAYER FREE MAGNETIC LAYER HAVING INSERTED NONMAGNETIC METAL SUBLAYER

(75) Inventors: Kazumasa Nishimura, Niigata-ken (JP); Ryo Nakabayashi, Niigata-ken (JP); Yosuke Ide, Niigata-ken (JP); Hasahiko Ishizone, Niigata-ken (JP); Masamichi Saito, Niigata-ken (JP); Naoya Hasegawa, Niigata-ken (JP); Yoshihiro Nishiyana, Niigata-ken (JP); Akio Hanada, Niigata-ken (JP); Hidekezu Kobayashi, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 13/025,842

(22) Filed: Feb. 11, 2011

(65) Prior Publication Data

US 2011/0129690 A1    Jun. 2, 2011

Related U.S. Application Data

(62) Division of application No. 11/866,609, filed on Oct. 3, 2007, now abandoned, and a division of application No. 11/671,783, filed on Feb. 6, 2007, now abandoned.

(30) Foreign Application Priority Data

Dec. 28, 2006 (JP) ................................. 2006-355019
Apr. 5, 2007 (JP) ................................. 2007-099278

(51) Int. Cl.
*G11B 5/33* (2006.01)

(52) U.S. Cl. ..................................... 360/324.2; 360/324
(58) Field of Classification Search ................ 360/324.2
See application file for complete search history.

(56) References Cited

U.S. PATENT DOCUMENTS

| 6,452,385 | B1* | 9/2002 | Shimazawa et al. | .......... 324/252 |
| 6,661,623 | B1 | 12/2003 | Tsuchiya et al. | |
| 6,785,102 | B2 | 8/2004 | Freitag et al. | |
| 6,927,952 | B2 | 8/2005 | Shimizu et al. | |
| 7,606,009 | B2 | 10/2009 | Lin | |
| 2002/0051380 | A1 | 5/2002 | Kamiguchi et al. | |
| 2003/0137785 | A1 | 7/2003 | Saito | |

(Continued)

FOREIGN PATENT DOCUMENTS

JP    2006-261637    9/2006

(Continued)

*Primary Examiner* — Daniell L Negron
*Assistant Examiner* — Carlos E Garcia
(74) *Attorney, Agent, or Firm* — Brinks Hofer Gilson & Lione

(57) ABSTRACT

A tunnel magnetoresistive element includes a laminate including a pinned magnetic layer, an insulating barrier layer, and a free magnetic layer. The insulating barrier layer is composed of Ti—Mg—O or Ti—O. The free magnetic layer includes an enhancement sublayer, a first soft magnetic sublayer, a nonmagnetic metal sublayer, and a second soft magnetic sublayer. For example, the enhancement sublayer is composed of Co—Fe, the first soft magnetic sublayer and the second soft magnetic sublayer are composed of Ni—Fe, and the nonmagnetic metal sublayer is composed of Ta. The total thickness of the average thickness of the enhancement sublayer and the average thickness of the first soft magnetic sublayer is in the range of 25 to 80 angstroms. Accordingly, the tunneling magnetoresistive element can consistently have a higher rate of resistance change than before.

6 Claims, 11 Drawing Sheets

U.S. PATENT DOCUMENTS

| | | |
|---|---|---|
| 2003/0197987 A1 | 10/2003 | Saito |
| 2003/0227722 A1 | 12/2003 | Freitag et al. |
| 2005/0264951 A1 | 12/2005 | Gill |
| 2006/0262460 A1 | 11/2006 | Ide et al. |
| 2007/0047159 A1 | 3/2007 | Zhao et al. |

FOREIGN PATENT DOCUMENTS

JP  2006261637 A  *  9/2006

* cited by examiner

FIG. 8
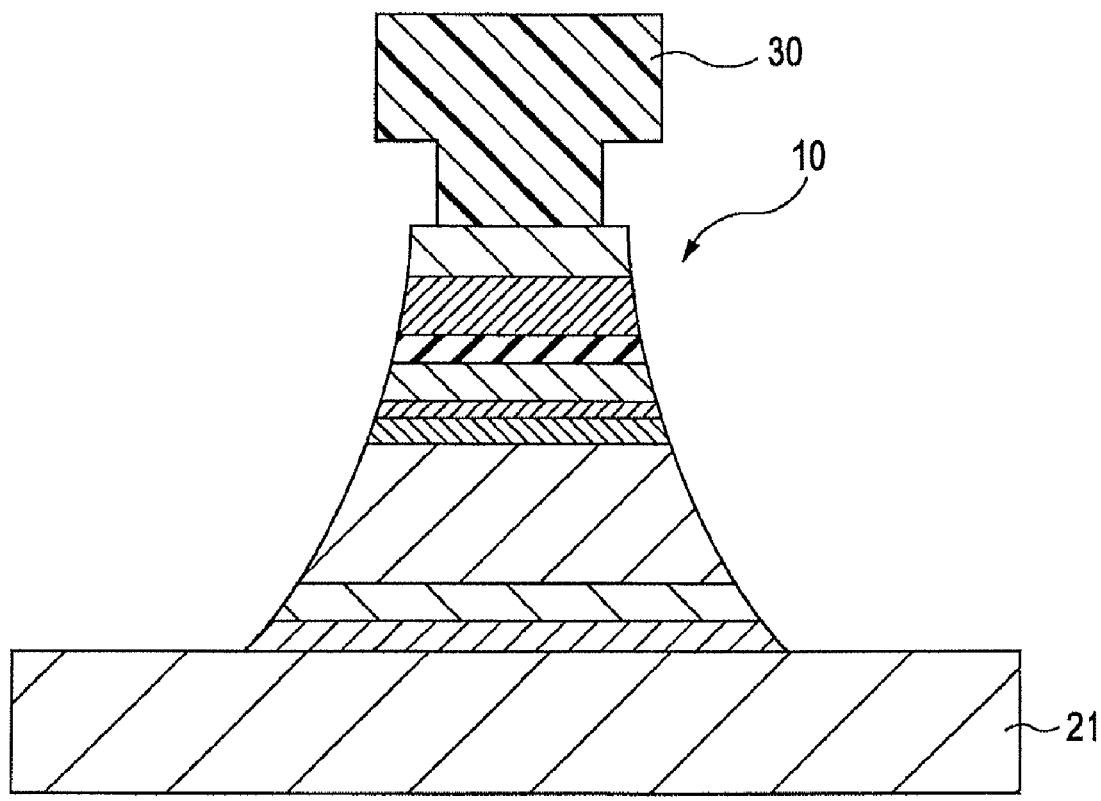
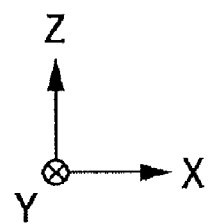

TUNNELING MAGNETORESISTIVE ELEMENT INCLUDING MULTILAYER FREE MAGNETIC LAYER HAVING INSERTED NONMAGNETIC METAL SUBLAYER

The present patent document is a divisional of U.S. patent application Ser. No. 11/866,609, filed Oct. 3, 2007 now abandoned and U.S. patent application Ser. No. 11/671,783, filed Feb. 6, 2007 now abandoned, which claims priority to Japanese Patent Application No. 2006-355019 filed in Japan on Dec. 28, 2006 and Japanese Patent Application No. 2007-0992788 filed in Japan on Apr. 5, 2007.

BACKGROUND

1. Field of the Invention

The present invention relates to a tunneling magnetoresistive element that may be installed in hard disk drives or magnetic detectors, and more particularly, it relates to a tunneling magnetoresistive element that can achieve a high rate of resistance change ($\Delta R/R$).

2. Discussion of the Related Art

Tunneling magnetoresistive (TMR) elements generate a resistance change by utilizing a tunneling effect. When the magnetization direction of a pinned magnetic layer is antiparallel to the magnetization direction of a free magnetic layer, less tunneling current flows through an insulating barrier layer (tunnel barrier layer) disposed between the pinned magnetic layer and the free magnetic layer, and thereby the resistance reaches its peak. On the other hand, when the magnetization direction of the pinned magnetic layer is parallel to the magnetization direction of the free magnetic layer, the tunneling current reaches the maximum, and the resistance reaches the minimum.

According to this principle, an external magnetic field changes the magnetization of the free magnetic layer and thereby changes the electrical resistance. The tunneling magnetoresistive elements detect the change in electrical resistance as a voltage change and thereby detect a leakage magnetic field from a recording medium.

Japanese Unexamined Patent Application Publication No. 2006-261637 discloses a tunneling magnetoresistive element that includes a free magnetic layer having a layered ferri structure.

In this patent document, the free magnetic layer includes ferromagnetic layers and a first orientation control buffer disposed between the ferromagnetic layers to generate large exchange coupling. A free magnetic layer including Ni81Fe19 (2 nm)/Ta (0.4 nm)/Ni81Fe19 (2 nm)/Ru (2.1 nm)/Ni81Fe19 (4 nm) laminated in that order from the bottom is disclosed in paragraph [0139].

However, this patent document does not disclose a structure that can achieve a high rate of resistance change ($\Delta R/R$).

BRIEF SUMMARY

Accordingly, the present invention aims to solve the problems described above. The present invention provides a tunneling magnetoresistive element that can achieve a high rate of resistance change ($\Delta R/R$).

According to one aspect of the present invention, a tunneling magnetoresistive element includes a laminate that includes a pinned magnetic layer having a fixed magnetization direction, an insulating barrier layer, and a free magnetic layer having a variable magnetization direction according to an external magnetic field, laminated in that order from the bottom, or a laminate that includes the free magnetic layer, the insulating barrier layer, and the pinned magnetic layer, laminated in that order from the bottom. The insulating barrier layer is composed of Ti—Mg—O (titanium oxide/magnesium oxide) or Ti—O (titanium oxide). The free magnetic layer includes a plurality of soft magnetic sublayers, a nonmagnetic metal sublayer separating the soft magnetic sublayers, and an enhancement sublayer disposed between a first soft magnetic sublayer and the insulating barrier layer and having a spin polarizability higher than those of the soft magnetic sublayers. The first soft magnetic sublayer is closest to the insulating barrier layer of the soft magnetic sublayers. The soft magnetic sublayers are magnetically coupled to each other and thereby have the same magnetization direction. The total of the average thickness of the first soft magnetic sublayer and the average thickness of the enhancement sublayer is at least 25 angstroms.

The tunneling magnetoresistive element including the Ti—Mg—O or Ti—O insulating barrier layer exhibits a rate of resistance change ($\Delta R/R$) higher than before. This is achieved by separating the soft magnetic sublayers in the free magnetic layer with a nonmagnetic metal sublayer and optimizing the distance between the nonmagnetic metal sublayer and the insulating barrier layer (the total of the average thickness of the first soft magnetic sublayer and the average thickness of the enhancement sublayer).

Unlike Japanese Unexamined Patent Application Publication No. 2006-261637, the free magnetic layer according to the present invention does not have a layered ferri structure. If the free magnetic layer has a layered ferri structure, a unidirectional bias magnetic field, which flows into the free magnetic layer from hard bias layers disposed on both sides of the free magnetic layer in the track width direction, disturbs the antiparallel magnetization state of two pinned magnetic sublayers separated by a nonmagnetic intermediate sublayer in the pinned magnetic layer, thus often causing Barkhausen noise. Furthermore, if the free magnetic layer has a layered ferri structure, the free magnetic layer often has a large coercive force. The coercive force is preferably as small as possible.

The nonmagnetic metal sublayer disposed between the soft magnetic sublayers has a small thickness to magnetically couple the soft magnetic sublayers and magnetize all the soft magnetic sublayers in one direction. Thus, the nonmagnetic metal sublayer does not interrupt the magnetic coupling between the soft magnetic sublayers. Furthermore, the absence of a layered ferri structure results in reduced or no Barkhausen noise and a lower coercive force. Hence, a tunneling magnetoresistive element according to the present invention has stable read characteristics.

Preferably, the total of the average thickness of the first soft magnetic sublayer and the average thickness of the enhancement sublayer is 80 angstroms or less. Thus, a tunneling magnetoresistive element according to the present invention can consistently have a high rate of resistance change ($\Delta R/R$).

Preferably, the average thickness of the first soft magnetic sublayer is in the range of 15 to 70 angstroms. Preferably, the average thickness of the enhancement sublayer is in the range of 10 to 30 angstroms. Thus, a tunneling magnetoresistive element according to the present invention can consistently have a high rate of resistance change ($\Delta R/R$).

Preferably, the laminate further includes a protective layer as a top layer. The protective layer includes a first protective sublayer as a bottom sublayer and is composed of at least one selected from the group consisting of Ru, Al, Ni—Fe—Cr, Ir—Mn, and Cr.

According to another aspect of the present invention, a tunneling magnetoresistive element includes a laminate that includes a pinned magnetic layer having a fixed magnetization direction, an insulating barrier layer, and a free magnetic layer having a variable magnetization direction according to an external magnetic field, laminated in that order from the bottom, or a laminate that includes the free magnetic layer, the insulating barrier layer, and the pinned magnetic layer, laminated in that order from the bottom. The free magnetic layer includes a plurality of soft magnetic sublayers, a nonmagnetic metal sublayer separating the soft magnetic sublayers, and an enhancement sublayer disposed between a first soft magnetic sublayer and the insulating barrier layer and having a spin polarizability higher than those of the soft magnetic sublayers. The first soft magnetic sublayer is closest to the insulating barrier layer of the soft magnetic sublayers. The soft magnetic sublayers are magnetically coupled to each other and thereby have the same magnetization direction. The laminate further includes a protective layer, as a top layer, that includes a first protective sublayer as a bottom sublayer and that is composed of at least one selected from the group consisting of Ru, Al, Ni—Fe—Cr, Ir—Mn, and Cr.

The tunneling magnetoresistive element that includes the first protective sublayer composed of at least one selected from the group consisting of Ru, Al, Ni—Fe—Cr, Ir—Mn, and Cr exhibits a rate of resistance change ($\Delta R/R$) higher than before. This is achieved by separating the soft magnetic sublayers in the free magnetic layer with a nonmagnetic metal sublayer.

A tunneling magnetoresistive element that further includes a second protective sublayer disposed on the first protective sublayer and composed of Ta can effectively achieve a high rate of resistance change ($\Delta R/R$).

Preferably, the nonmagnetic metal sublayer is composed of at least one selected from the group consisting of Ti, V, Zr, Nb, Mo, Hf, Ta, and W. More preferably, the nonmagnetic metal sublayer is composed of Ta. These can effectively increase the rate of resistance change ($\Delta R/R$).

Preferably, the average thickness of the nonmagnetic metal sublayer is in the range of one to four angstroms. Because the nonmagnetic metal sublayer has such a small thickness, the soft magnetic sublayers can be magnetically coupled in an appropriate manner. This results in an increase in rate of resistance change ($\Delta R/R$), reduced or no Barkhausen noise, and reduced variations in asymmetry of reproduced waveform, thus improving the stability of the read characteristics.

Preferably, the soft magnetic sublayers are formed of a Ni—Fe alloy, and the enhancement sublayer is formed of a Co—Fe alloy, in terms of a rate of resistance change ($\Delta R/R$).

Consequently, a tunneling magnetoresistive element according to the present invention can have a rate of resistance change ($\Delta R/R$) higher than before.

BRIEF DESCRIPTION OF THE DRAWINGS

FIG. 8 is a cross-sectional view illustrating a step subsequent to the step illustrated in FIG. 7;

DETAILED DESCRIPTION OF THE DRAWINGS AND THE PRESENTLY PREFERRED EMBODIMENTS

Figure 1:
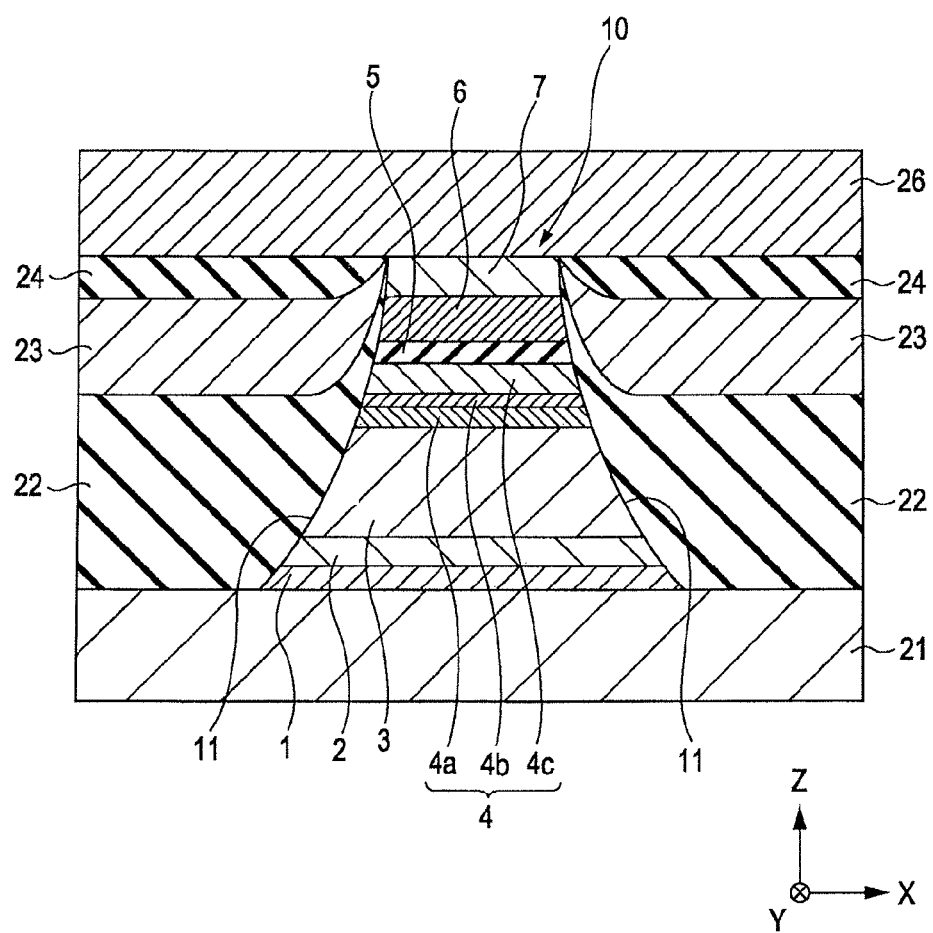
FIG. 1 is a cross-sectional view of a tunneling magnetoresistive element, taken parallel to a plane of a recording medium.
Figure 2:
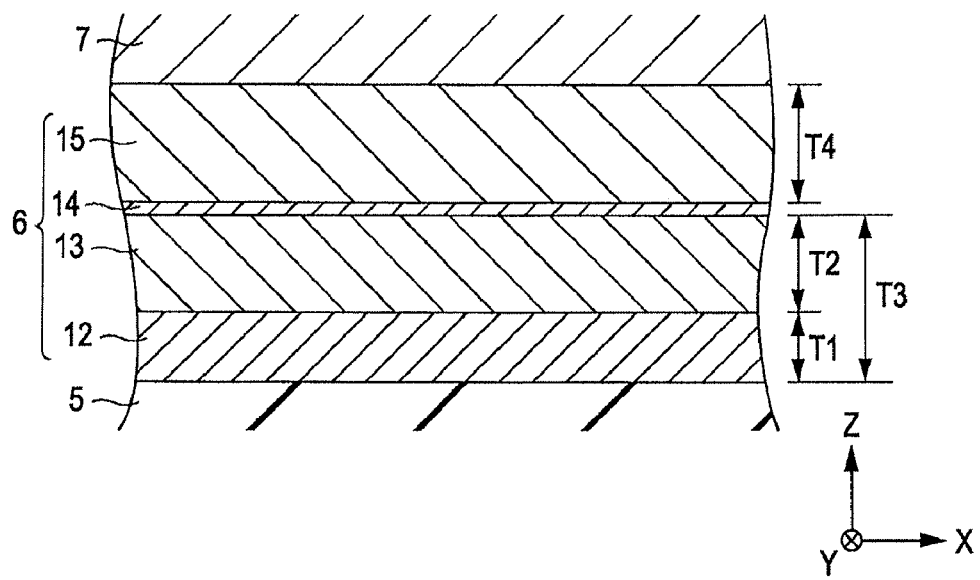
FIG. 2 is a fragmentary enlarged cross-sectional view of a tunneling magnetoresistive element according to an embodiment of the present invention, taken in the same direction as in FIG. 1.
Figure 3:
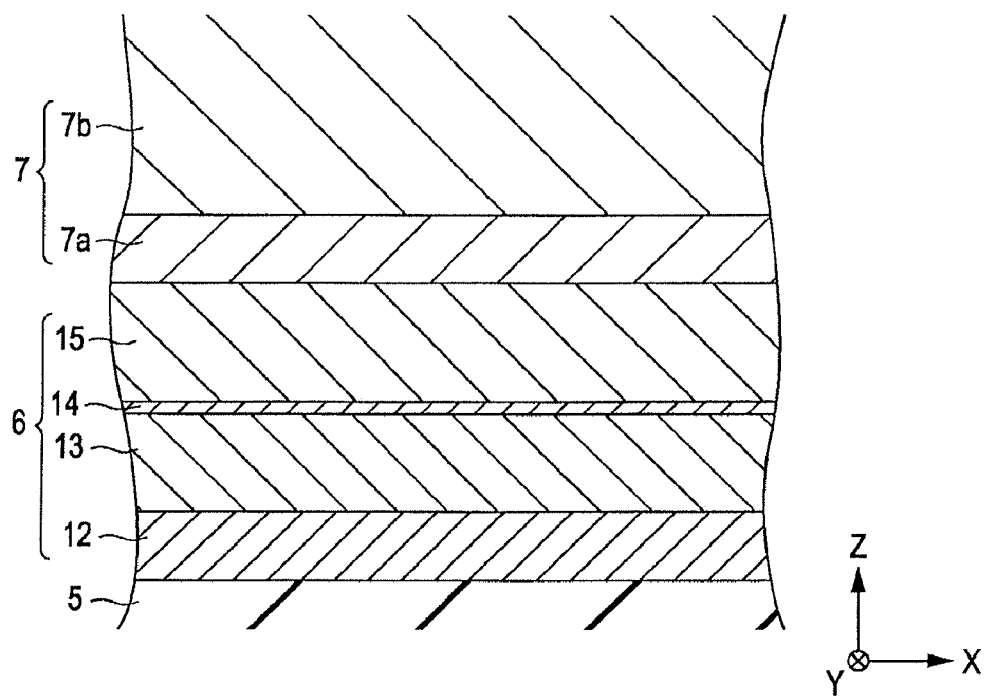
FIG. 3 is a fragmentary enlarged cross-sectional view of a tunneling magnetoresistive element according to another embodiment of the present invention, taken in the same direction as in FIG. 1.

FIG. 1 is a cross-sectional view of a tunneling magnetoresistive element according to an embodiment of the present invention, taken parallel to a plane of a recording medium. FIGS. 2 and 3 are fragmentary enlarged cross-sectional views of a tunneling magnetoresistive element according to an embodiment of the present invention. Common components in FIGS. 1 to 3 are principally described with reference to FIG. 1. Thus, while a free magnetic layer illustrated in FIG. 1 appears to have a monolayer structure, the free magnetic layer actually has a structure illustrated in FIGS. 2 and 3.

A tunneling magnetoresistive element is, for example, mounted on a trailing edge of a flying slider in a hard disk drive to detect a leakage magnetic field (recorded magnetic field) from a magnetic recording medium. In the drawings, the X direction is the track width direction, the Y direction is the direction of a leakage field from a magnetic recording medium (height direction), and the Z direction is the traveling direction of the magnetic recording medium or the lamination direction in the tunneling magnetoresistive element.

The bottom layer in FIG. 1 is a first shielding layer 21, for example, formed of a Ni—Fe alloy. A laminate 10 is disposed on the first shielding layer 21. The tunneling magnetoresistive element includes the laminate 10, and first insulating layers 22, hard bias layers 23, and second insulating layers 24, disposed on both sides of the laminate 10 in the track width direction (X direction).

The bottom layer of the laminate 10 is an underlying layer 1 composed of at least one nonmagnetic element selected from the group consisting of Ta, Hf, Nb, Zr, Ti, Mo, and W. A seed layer 2 is disposed on the underlying layer 1. The seed layer 2 is composed of Ni—Fe—Cr or Cr. The underlying layer 1 may be eliminated.

An antiferromagnetic layer 3 disposed on the seed layer 2 is preferably formed of an antiferromagnetic material containing an element X and Mn, wherein X is at least one element selected from the group consisting of Pt, Pd, Ir, Rh, Ru, and Os.

Alternatively, the antiferromagnetic layer 3 may be formed of an antiferromagnetic material containing an element X, an element X', and Mn, wherein the element X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare-earth elements.

The antiferromagnetic layer 3 may be composed of Ir—Mn. A pinned magnetic layer 4 is disposed on the antiferromagnetic layer 3. The pinned magnetic layer 4 has a layered ferri structure including a first pinned magnetic sublayer 4a, a nonmagnetic intermediate sublayer 4b, and a second pinned magnetic sublayer 4c, laminated in that order from the bottom. The magnetization directions of the first pinned magnetic sublayer 4a and the second pinned magnetic sublayer 4c are antiparallel to each other owing to an exchange coupling magnetic field (Hex) at an interface between the antiferromagnetic layer 3 and the pinned magnetic layer 4 and owing to an antiferromagnetic exchange coupling magnetic field (RKKY interaction) via the nonmagnetic intermediate sublayer 4b. The pinned magnetic layer 4 can have a stable magnetization because of the layered ferri structure. The layered ferri structure can also increase an apparent exchange coupling magnetic field generated at the interface between the pinned magnetic layer 4 and the antiferromagnetic layer 3. The first pinned magnetic sublayer 4a and the second pinned magnetic sublayer 4c may have a thickness in the range of 10 to 40 angstroms. The nonmagnetic intermediate sublayer 4b may have a thickness in the range of 8 to 10 angstroms.

The first pinned magnetic sublayer 4a and the second pinned magnetic sublayer 4c are formed of a ferromagnetic material such as Co—Fe, Ni—Fe, or Co—Fe—Ni. The nonmagnetic intermediate sublayer 4b is formed of a nonmagnetic conductive material such as Ru, Rh, Ir, Cr, Re, or Cu.

An insulating barrier layer 5 and a free magnetic layer 6 are disposed in that order on the pinned magnetic layer 4. The free magnetic layer 6 has a structure as described below.

The width of the free magnetic layer 6 in the track width direction (X direction) defines the track width Tw. A protective layer 7, for example, composed of Ta is disposed on the free magnetic layer 6.

End faces 11 of the laminate 10 in the track width direction (X direction) are such inclined faces that the width of the laminate 10 in the track width direction decreases gradually from the bottom to the top.

As illustrated in FIG. 1, the first insulating layers 22 are disposed on the first shielding layer 21 along the end faces 11 of the laminate 10. The hard bias layers 23 are disposed on the first insulating layers 22. The second insulating layers 24 are disposed on the hard bias layers 23.

Bias underlying layers (not shown) may be disposed between the first insulating layers 22 and the hard bias layers 23. The bias underlying layers may be composed of Cr, W, and/or Ti.

The first insulating layers 22 and the second insulating layers 24 are formed of an insulating material such as $Al_2O_3$ or $SiO_2$. The first insulating layers 22 and the second insulating layers 24 insulate the hard bias layers 23 to prevent an electric current flowing through the laminate 10 in a direction perpendicular to the interfaces between the layers of the laminate 10 from being shunted to both sides of the laminate 10 in the track width direction. The hard bias layers 23 may be formed of a Co—Pt alloy or a Co—Cr—Pt alloy.

A second shielding layer 26, for example, formed of a Ni—Fe alloy is disposed on the laminate 10 and the second insulating layers 24.

In the tunneling magnetoresistive element illustrated in FIG. 1, the first shielding layer 21 and the second shielding layer 26 function as electrode layers of the laminate 10. An electric current therefore flows in a direction perpendicular to the layers of the laminate 10 (in a direction parallel to the Z direction).

The free magnetic layer 6 is magnetized in a direction parallel to the track width direction (X direction) under the influence of a bias magnetic field of the hard bias layers 23. The first pinned magnetic sublayer 4a and the second pinned magnetic sublayer 4c in the pinned magnetic layer 4 are magnetized in a direction parallel to the height direction (Y direction). Because the pinned magnetic layer 4 has the layered ferri structure, the magnetization direction of the first pinned magnetic sublayer 4a is antiparallel to the magnetization direction of the second pinned magnetic sublayer 4c. While the magnetization of the pinned magnetic layer 4 is fixed (does not change with an external magnetic field), the magnetization of the free magnetic layer 6 changes with the external magnetic field.

When the magnetization direction of the second pinned magnetic sublayer 4c is antiparallel to the magnetization direction of the free magnetic layer 6, a change in the magnetization of the free magnetic layer 6 caused by an external magnetic field reduces a tunneling current flowing through the insulating barrier layer 5 disposed between the second pinned magnetic sublayer 4c and the free magnetic layer 6, thus maximizing the resistance. On the other hand, when the magnetization direction of the second pinned magnetic sublayer 4c is parallel to the magnetization direction of the free magnetic layer 6, a change in the magnetization of the free magnetic layer 6 caused by an external magnetic field maximizes the tunneling current, thus minimizing the resistance.

According to this principle, an external magnetic field changes the magnetization of the free magnetic layer 6 and thereby changes the electrical resistance. The tunneling magnetoresistive element detects the change in electrical resistance as a voltage change and thereby detects a leakage field from a magnetic recording medium.

The features of the tunneling magnetoresistive element according to the present embodiment will be described below. FIG. 2 is an enlarged cross-sectional view of the free magnetic layer 6 in the tunneling magnetoresistive element illustrated in FIG. 1.

As illustrated in FIG. 2, the free magnetic layer 6 includes an enhancement sublayer 12, a first soft magnetic sublayer 13, a nonmagnetic metal sublayer 14, and a second soft magnetic sublayer 15, laminated in that order from the bottom.

The enhancement sublayer 12 is formed of a magnetic material having a spin polarizability higher than those of the first soft magnetic sublayer 13 and the second soft magnetic sublayer 15. Preferably, the enhancement sublayer 12 is formed of a Co—Fe alloy. In the absence of the enhancement sublayer 12, the rate of resistance change ($\Delta R/R$) is known to decrease significantly. The enhancement sublayer 12 is therefore indispensable. An increase in the Fe content in the Co—Fe alloy constituting the enhancement sublayer 12 can lead to a higher rate of resistance change ($\Delta R/R$). Preferably, the Fe content in the Co—Fe alloy is in the range of 50 to 100 atomic percent.

The first soft magnetic sublayer 13 and the second soft magnetic sublayer 15 have a lower coercive force and a smaller anisotropic magnetic field than the enhancement sublayer 12, and therefore excellent soft magnetic characteristics. While the first soft magnetic sublayer 13 and the second soft magnetic layer 15 may be formed of different soft magnetic materials, these soft magnetic sublayers are preferably formed of a Ni—Fe alloy. Preferably, the Fe content in the Ni—Fe alloy is in the range of 5 to 20 atomic percent.

The nonmagnetic metal sublayer 14 is composed of at least one nonmagnetic metal selected from the group consisting of Ti, V, Zr, Nb, Mo, Hf, Ta, and W. When the nonmagnetic metal sublayer 14 is composed of at least two nonmagnetic metals, the nonmagnetic metal sublayer 14 may be formed of an alloy or a laminate of nonmagnetic metal layers.

In the present embodiment, the nonmagnetic metal sublayer 14 is preferably composed of Ta. The nonmagnetic metal sublayer 14 has a small thickness to magnetically couple the first soft magnetic sublayer 13 and the second soft magnetic sublayer 15, and to magnetize the first soft magnetic sublayer 13 and the second soft magnetic sublayer 15 in one direction. For example, the first soft magnetic sublayer 13 and the second soft magnetic sublayer 15 are magnetized in the X direction. Furthermore, the enhancement sublayer 12 is also magnetized in the X direction.

Preferably, the average thickness of the nonmagnetic metal sublayer 14 is in the range of one to four angstroms. The average thickness of the nonmagnetic metal sublayer 14 less than one angstrom results in a low rate of resistance change ($\Delta R/R$). On the other hand, the average thickness of the nonmagnetic metal sublayer 14 more than four angstroms may result in an interruption of the magnetically coupling between the first soft magnetic sublayer 13 and the second soft magnetic sublayer 15. This interruption may cause Barkhausen noise and variations in asymmetry of reproduced waveform, resulting in unstable read characteristics. In the present embodiment, therefore, the average thickness of the nonmagnetic metal sublayer 14 is preferably in the range of one to four angstroms.

As described above, the average thickness of the nonmagnetic metal sublayer 14 is very small. Thus, the nonmagnetic metal sublayer 14 may discontinuously be formed on the first soft magnetic sublayer 13, unlike the continuous film having a constant thickness as illustrated in FIG. 2. A discontinuous nonmagnetic metal sublayer 14 can enhance the magnetic coupling (ferromagnetic coupling) between the first soft magnetic sublayer 13 and the second soft magnetic sublayer 15. "The average thickness of nonmagnetic metal sublayer 14" is the thickness of a nonmagnetic metal sublayer 14 uniformly formed over the first soft magnetic sublayer 13. Thus, the "average thickness" of a discontinuous nonmagnetic metal sublayer 14 is determined with consideration given to portions (pinholes) at which the nonmagnetic metal sublayer 14 is not formed on the first soft magnetic sublayer 13.

In FIG. 2, the insulating barrier layer 5 is composed of Ti—Mg—O. Preferably, the Mg content is in the range of 4 to 20 atomic percent per 100 atomic percent of Ti and Mg. This can effectively increase the rate of resistance change ($\Delta R/R$).

In the present embodiment, the total thickness T3 of the average thickness T1 of the enhancement sublayer 12 and the average thickness T2 of the first soft magnetic sublayer 13 is at least 25 angstroms. Thus, the distance between the nonmagnetic metal sublayer 14 and the insulating barrier layer 5 is at least 25 angstroms.

This increases the rate of resistance change ($\Delta R/R$) as compared with existing structures including no nonmagnetic metal sublayer 14 in the free magnetic layer 6. It is possible to set the resistance-area (RA) product to be substantially the same as those of the existing structures, and reduce variations in resistance-area (RA) product.

The reason for the increase in rate of resistance change ($\Delta R/R$) is probably as follows: oxygen atoms diffusing from the insulating barrier layer 5 into the first and second soft magnetic sublayers 13 and 15 or into the enhancement sublayer 12 are preferentially chemically bonded to the nonmagnetic metal sublayer 14. This reduces the oxygen contents and thereby optimizes the band structures in the first and second soft magnetic sublayers 13 and 15 or the enhancement sublayer 12, thus improving the spin polarizability.

In the present embodiment, the second soft magnetic sublayer 15 may effectively have a face-centered cubic (fcc) structure in which equivalent crystal faces represented by a {111} plane are preferably oriented parallel to the second soft magnetic sublayer 15 (X-Y plane).

Preferably, the total thickness T3 is 80 angstroms or less. The total thickness T3 more than 80 angstroms results in no increase in rate of resistance change ($\Delta R/R$). Hence, a high rate of resistance change ($\Delta R/R$) can consistently be achieved at the total thickness T3 in the range of 25 to 80 angstroms.

Preferably, the average thickness T2 of the first soft magnetic sublayer 13 is in the range of 15 to 70 angstroms. In this range, a tunneling magnetoresistive element according to the present embodiment can consistently have a higher rate of resistance change ($\Delta R/R$) than before. More preferably, the average thickness T2 is 60 angstroms or less.

Preferably, the total thickness T3 is more than 30 angstroms. In this case, the average thickness T2 of the first soft magnetic sublayer 13 is more preferably more than 20 angstroms.

The average thickness T2 of the first soft magnetic sublayer 13 preferably accounts for 50% to 90%, more preferably 60% to 87.5%, and still more preferably 67% to 87.5% of the total thickness T3.

In these ranges, a tunneling magnetoresistive element according to the present embodiment can consistently have a high rate of resistance change ($\Delta R/R$).

Preferably, the average thickness T1 of the enhancement sublayer 12 is in the range of 10 to 30 angstroms. In this range, a tunneling magnetoresistive element according to the present embodiment can consistently have a high rate of resistance change ($\Delta R/R$).

Preferably, the average thickness T4 of the second soft magnetic sublayer 15 is in the range of 20 to 50 angstroms.

Preferably, the total thickness of the first and second soft magnetic sublayers 13 and 15 is in the range of 35 to 80 angstroms.

While the insulating barrier layer 5 is composed of Ti—Mg—O in the present embodiment, the insulating barrier layer 5 composed of Ti—O can also achieve the same resistance-area (RA) product as before, and a higher rate of resistance change ($\Delta R/R$) than before.

Also in the insulating barrier layer 5 composed of Ti—O, the rate of resistance change ($\Delta R/R$) can be higher than before at a total thickness T3 of at least 25 angstroms. Furthermore, in the insulating barrier layer 5 composed of Ti—O, the upper limit and the preferred range of the total thickness T3 and the preferred range of the average thickness T2 of the first soft magnetic sublayer 13 are the same as in the insulating barrier layer 5 composed of Ti—Mg—O.

FIG. 3 is an enlarged cross-sectional view of the free magnetic layer 6 and a protective layer 7 in the tunneling magnetoresistive element illustrated in FIG. 1

The free magnetic layer 6 has the same structure as that described with reference to FIG. 2.

The protective layer 7 composed of a first protective sublayer 7a and a second protective sublayer 7b is disposed on the free magnetic layer 6.

The first protective sublayer 7a is composed of at least one selected from the group consisting of Ru, Al, Ni—Fe—Cr, Ir—Mn, and Cr. When the first protective sublayer 7a is composed of at least two metals, the first protective sublayer 7a may be formed of an alloy or a laminate of metal layers. The first protective sublayer 7a composed of Ni—Fe—Cr may have a composition of $Ni_{49at\%}Fe_{12at\%}Cr_{39at\%}$. The first protective sublayer 7a composed of Ir—Mn may have a composition of $Ir_{26at\%}Mn_{74at\%}$. The second protective sublayer 7b may be composed of a metal, such as Ta, Ti, Al, Cu, Fe, Ni, Mn, Co, or V, or an oxide or a nitride thereof, which has been used in existing protective layers. Preferably, the second protective sublayer 7b is composed of Ta in terms of low electrical resistance and mechanical protection.

In FIG. 3, the insulating barrier layer 5 may be composed of a material other than Ti—Mg—O and Ti—O. For example, the insulating barrier layer 5 may be composed of Al—O (aluminum oxide) or Mg—O (magnesium oxide).

In FIG. 3, while the average thickness T1 of the enhancement sublayer 12, the average thickness T2 of the first soft magnetic sublayer 13, and the total thickness T3 of T1 and T2 are preferably in the ranges described with reference to FIG. 2, these thicknesses are not limited to these ranges. As in FIG. 2, the nonmagnetic metal sublayer 14 in FIG. 3 also has a small thickness (more specifically in the range of one to four angstroms) to magnetically couple the first soft magnetic sublayer 13 and the second soft magnetic sublayer 15, and to magnetize the first soft magnetic sublayer 13 and the second soft magnetic sublayer 15 in one direction.

The first protective sublayer 7a is composed of Ru, Al, Ni—Fe—Cr, Ir—Mn, or Cr. The nonmagnetic metal sublayer 14 separates the first soft magnetic sublayer 13 from the second soft magnetic sublayer 15. Thus, the tunneling magnetoresistive element according to the present embodiment can have a high rate of resistance change ($\Delta R/R$). Furthermore, it is possible to set the resistance-area (RA) product to be substantially the same as those of existing structures including no nonmagnetic metal sublayer 14, and reduce variations in resistance-area (RA) product. In the examples described below, first protective sublayers 7a each composed of Ru, Al, Ni—Fe—Cr, Ir—Mn, or Cr equally achieved a high rate of resistance change ($\Delta R/R$).

Because a high rate of resistance change ($\Delta R/R$) can be achieved with any of the candidate materials for the first protective sublayer 7a, any of various materials may be used for the first protective sublayer 7a.

The reason for the increase in rate of resistance change ($\Delta R/R$) is probably as follows: oxygen atoms diffusing from the insulating barrier layer 5 into the first and second soft magnetic sublayers 13 and 15 or into the enhancement sublayer 12 are preferentially chemically bonded to the nonmagnetic metal sublayer 14. This reduces the oxygen contents and thereby optimizes the band structures in the first and second soft magnetic sublayers 13 and 15 or the enhancement sublayer 12, thus improving the spin polarizability. In addition, the nonmagnetic metal sublayer 14 reduces the diffusion of an element constituting the protective layer 7 into the first soft magnetic sublayer 13 or the enhancement sublayer 12.

In FIG. 2, the protective layer 7 may have a monolayer structure of the second protective sublayer 7b. For example, the protective layer 7 may have a Ta monolayer structure. However, also in FIG. 2, the protective layer 7 having a monolayer structure of the first protective sublayer 7a or a layered structure of the first protective sublayer 7a and the second protective sublayer 7b, as illustrated in FIG. 3, is preferred in terms of the rate of resistance change ($\Delta R/R$).

In FIGS. 1 to 3, while the antiferromagnetic layer 3, the pinned magnetic layer 4, the insulating barrier layer 5, the free magnetic layer 6, and the protective layer 7 are laminated in that order from the bottom, the free magnetic layer 6, the insulating barrier layer 5, the pinned magnetic layer 4, the antiferromagnetic layer 3, and the protective layer 7 may be laminated in that order from the bottom.

Figure 4:
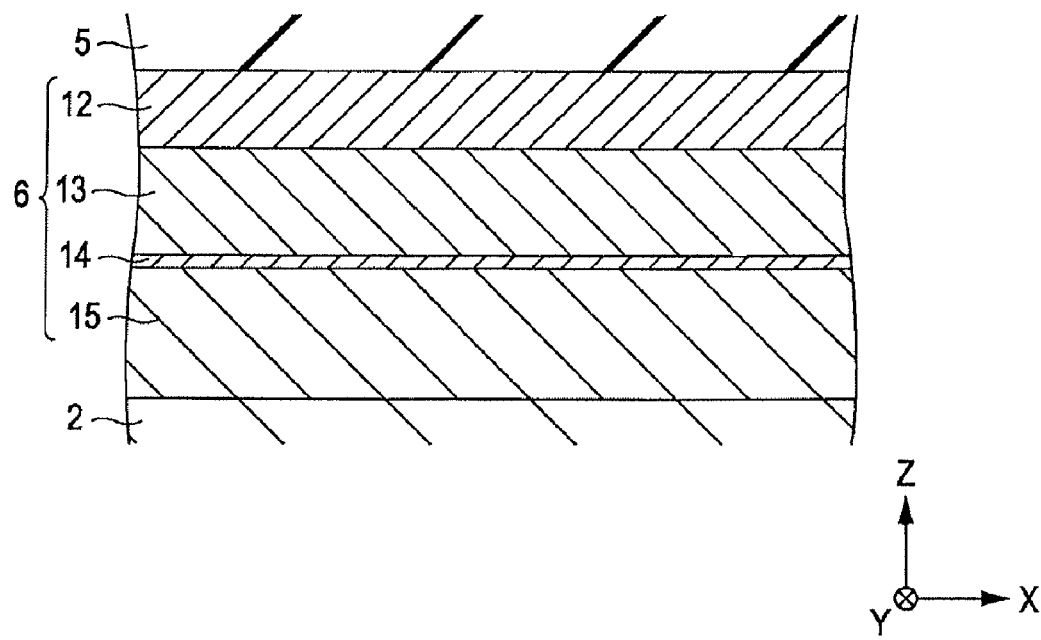
FIG. 4 is a fragmentary enlarged cross-sectional view of a tunneling magnetoresistive element according to still another embodiment of the present invention, taken in the same direction as in FIG. 1.

In the latter case, as illustrated in FIG. 4, the free magnetic layer 6 includes the second soft magnetic sublayer 15, the nonmagnetic metal sublayer 14, the first soft magnetic sublayer 13, and the enhancement sublayer 12, laminated in that order from the bottom, and the insulating barrier layer 5 is disposed on the free magnetic layer 6. The sublayers of the free magnetic layer 6 have the same thicknesses and are formed of the same materials as those described with reference to FIG. 2.

A tunneling magnetoresistive element may be a dual-type tunneling magnetoresistive element composed of a first antiferromagnetic layer, a first pinned magnetic layer, a first insulating barrier layer, a free magnetic layer, a second insulating barrier layer, a second pinned magnetic layer, and a second antiferromagnetic layer, laminated in that order from the bottom.

Figure 5:
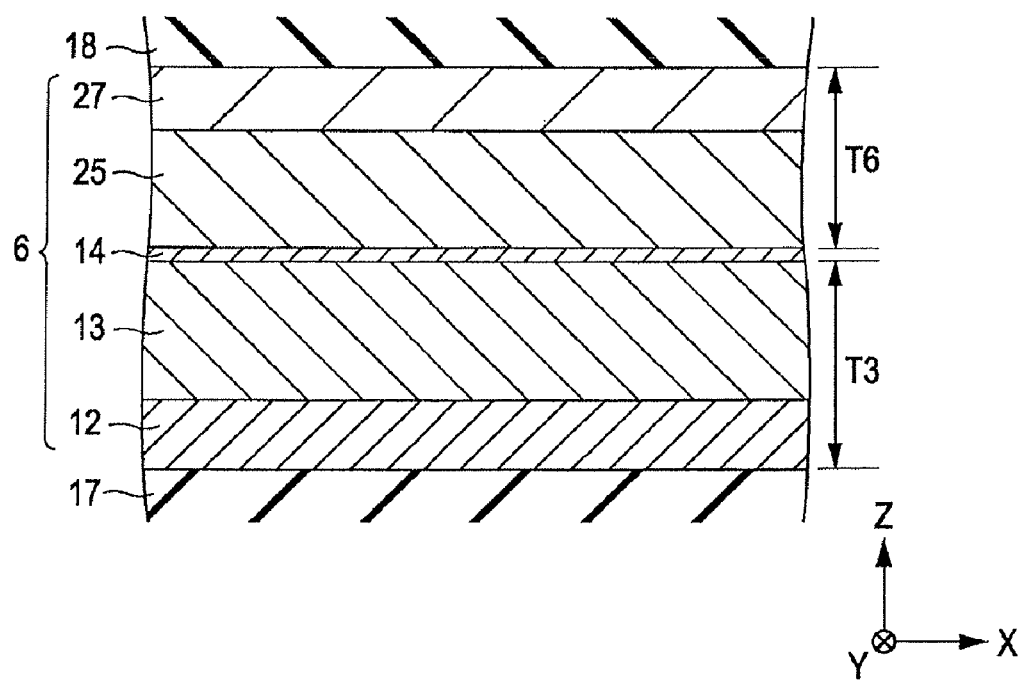
FIG. 5 is a fragmentary enlarged cross-sectional view of a tunneling magnetoresistive element according to still another embodiment of the present invention, taken in the same direction as in FIG. 1.

In the dual-type tunneling magnetoresistive element, as illustrated in FIG. 5, the free magnetic layer 6 is composed of the enhancement sublayer 12, the first soft magnetic sublayer 13, the nonmagnetic metal sublayer 14, a first soft magnetic sublayer 25, and an enhancement sublayer 27, laminated in that order from the bottom. A first insulating barrier layer 17 is disposed under the enhancement sublayer 12 of the free magnetic layer 6. A second insulating barrier layer 18 is disposed on the enhancement sublayer 27 of the free magnetic layer 6. The sublayers of the free magnetic layer 6 have the same thicknesses and are formed of the same materials as those described with reference to FIG. 2. In FIG. 5, the total thickness T6 of the average thickness of the enhancement sublayer 27 and the average thickness of the first soft magnetic sublayer 25 is preferably in the range of 25 to 80 angstroms, as in the total thickness T3 of the average thickness T1 of the enhancement sublayer 12 and the average thickness T2 of the first soft magnetic sublayer 13.

In FIGS. 2 to 5, while the free magnetic layer 6 includes a single nonmagnetic metal sublayer 14, the free magnetic layer 6 may include two or more nonmagnetic metal sublayers 14. In the latter case, the free magnetic layer 6 may include a first soft magnetic sublayer, a first nonmagnetic metal sublayer, a second soft magnetic sublayer, a second nonmagnetic metal sublayer, and a third soft magnetic sublayer. The number of nonmagnetic metal sublayers 14 is about eight or less.

Figure 9:
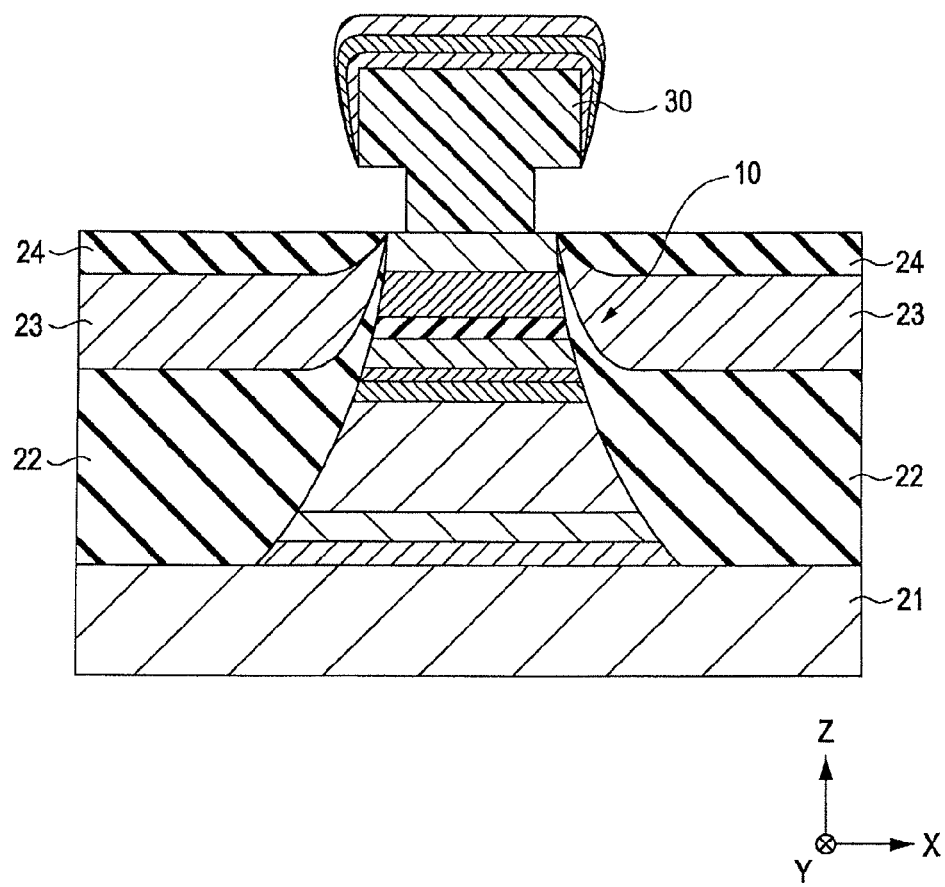
FIG. 9 is a cross-sectional view illustrating a step subsequent to the step illustrated in FIG. 8.

A method for manufacturing a tunneling magnetoresistive element according to an embodiment of the present invention will be described below. FIGS. 6 to 9 are cross-sectional views each illustrating a step of manufacturing a tunneling magnetoresistive element according to an embodiment of the present invention, taken in the same direction as in FIG. 1. In FIGS. 7 to 9, while a free magnetic layer 6 appears to have a monolayer structure, the free magnetic layer 6 actually has a structure illustrated in FIGS. 2 and 3.

Figure 6:
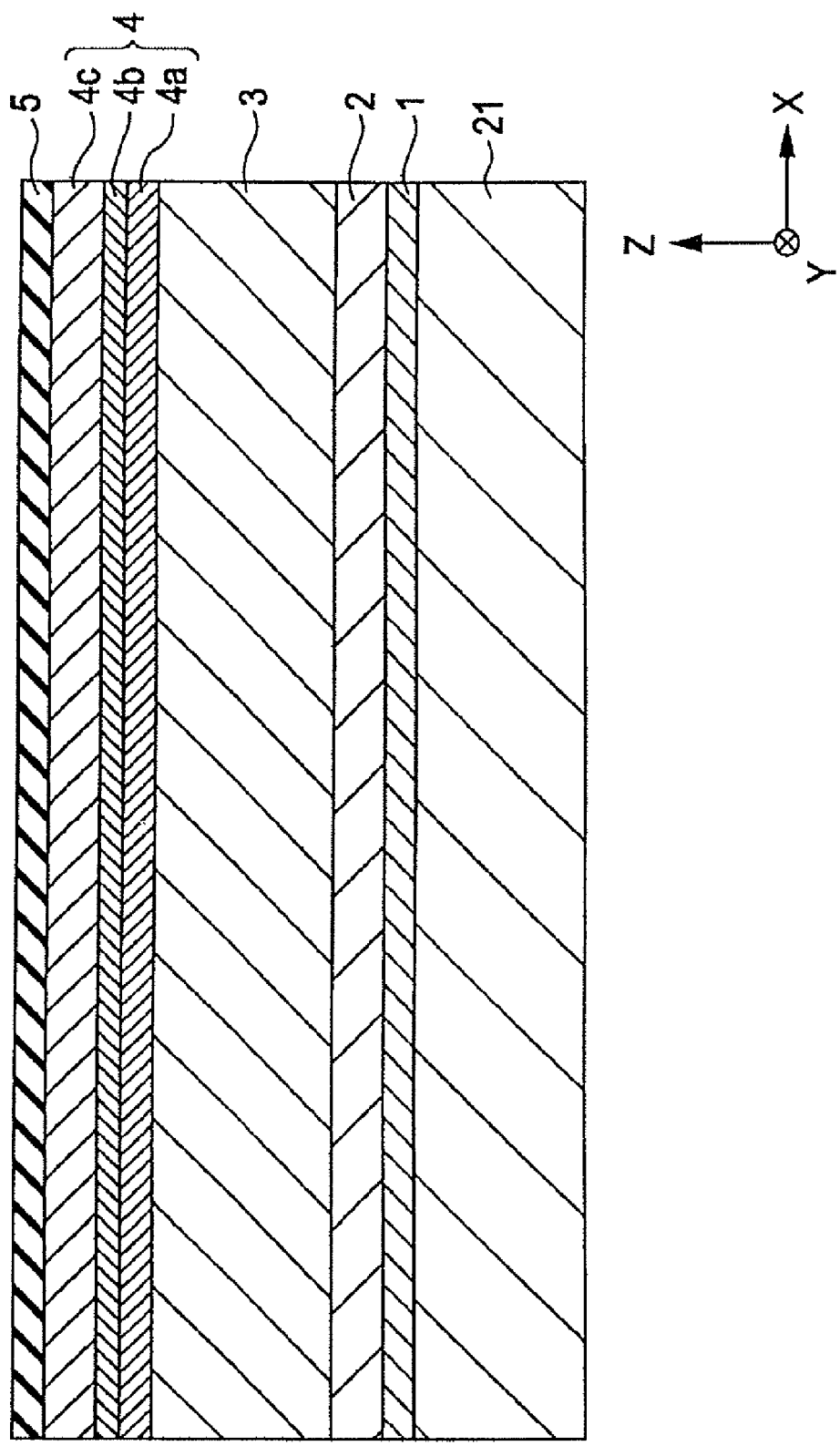
FIG. 6 is a cross-sectional view illustrating a step of manufacturing a tunneling magnetoresistive element according to an embodiment of the present invention, taken in the same direction as in FIG. 1.
Figure 7:
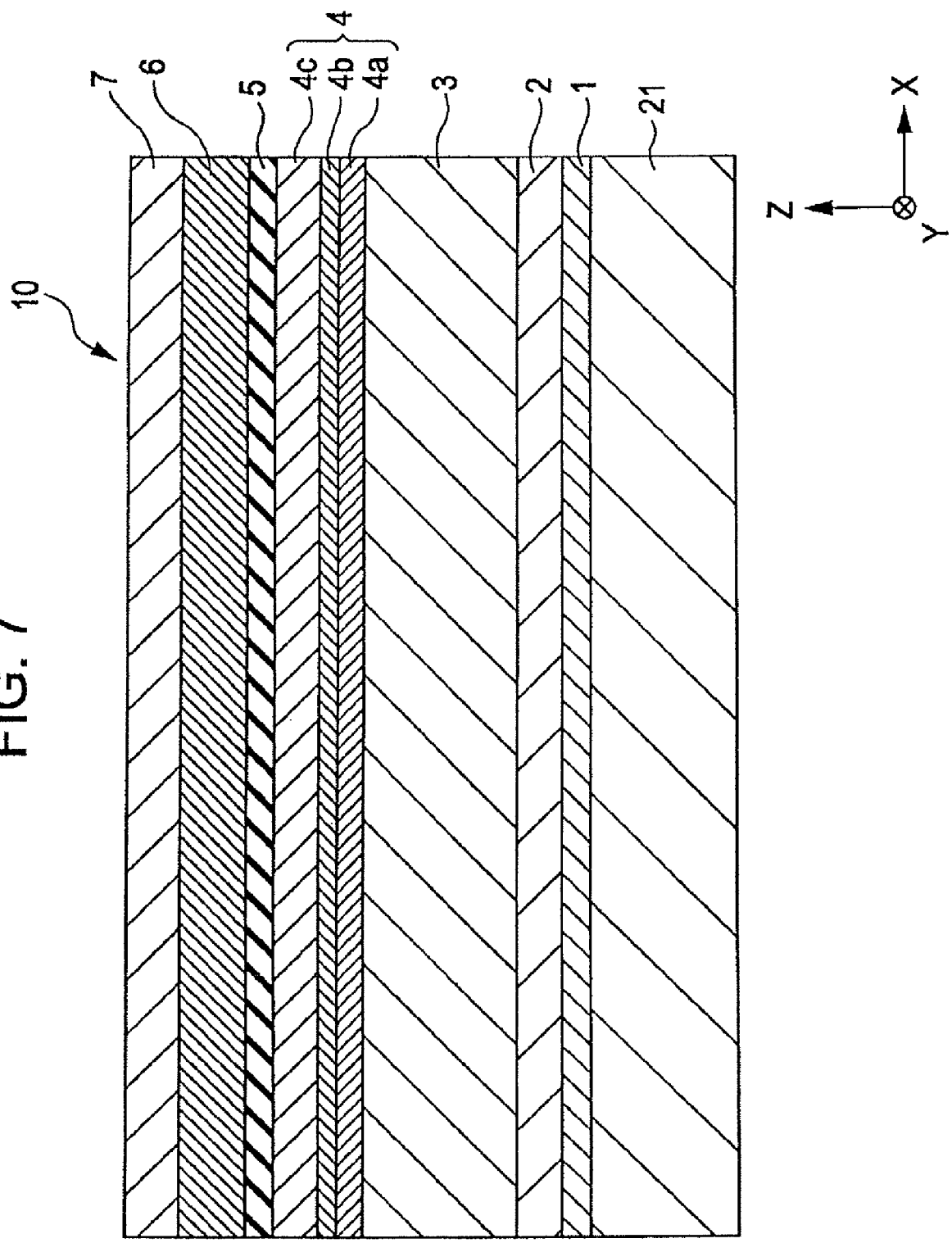
FIG. 7 is a cross-sectional view illustrating a step subsequent to the step illustrated in FIG. 6.

In a step illustrated in FIG. 6, an underlying layer 1, a seed layer 2, an antiferromagnetic layer 3, a first pinned magnetic sublayer 4a, a nonmagnetic intermediate sublayer 4b, and a second pinned magnetic sublayer 4c are successively formed on a first shielding layer 21.

In the manufacture of a tunneling magnetoresistive element illustrated in FIG. 1, an insulating barrier layer 5 composed of Ti—Mg—O or Ti—O is formed on the second pinned magnetic sublayer 4c. The insulating barrier layer 5 composed of Ti—Mg—O may be formed by depositing a Ti layer on the second pinned magnetic sublayer 4c by sputtering, depositing a Mg layer on the Ti layer by sputtering, and then oxidizing the Ti layer and the Mg layer. The insulating barrier layer 5 composed of Ti—O may be formed by depositing a Ti layer on the second pinned magnetic sublayer 4c by sputtering and then oxidizing the Ti layer.

As illustrated in FIG. 7, a free magnetic layer 6 and a protective layer 7 are formed on the insulating barrier layer 5. An enhancement sublayer 12, a first soft magnetic sublayer 13, a nonmagnetic metal sublayer 14, and a second soft magnetic sublayer 15 may be deposited to form the free magnetic layer 6, as illustrated in FIG. 2. Preferably, the enhancement sublayer 12 is formed of a Co—Fe alloy, the first soft magnetic sublayer 13 and the second soft magnetic sublayer 15 are formed of a Ni—Fe alloy, and the nonmagnetic metal sublayer 14 is composed of Ta.

The thicknesses of the enhancement sublayer 12 and the first soft magnetic sublayer 13 are adjusted so that the total thickness T3 of these sublayers is at least 25 angstroms, as described for FIG. 2. The nonmagnetic metal sublayer 14 is formed so as to have a small thickness, more specifically, in the range of one to four angstroms to magnetically couple the first soft magnetic sublayer 13 and the second soft magnetic sublayer 15 and to magnetize the first soft magnetic sublayer 13 and the second soft magnetic sublayer 15 in one direction.

Thus, a laminate 10 including the underlying layer 1 to the protective layer 7 is formed.

A lift-off resist layer 30 is then formed on the laminate 10. Both ends of the laminate 10 in the track width direction (X direction) that are not covered with the lift-off resist layer 30 are removed, for example, by etching (see FIG. 8).

First insulating layers 22, hard bias layers 23, and second insulating layers 24 are then formed on the first shielding layer 21 on both sides of the laminate 10 in the track width direction (X direction) (see FIG. 9).

After the lift-off resist layer 30 is removed, a second shielding layer 26 is formed on the laminate 10 and the second insulating layers 24.

In this method for manufacturing a tunneling magnetoresistive element, the laminate 10 is annealed. Annealing is typically performed to generate an exchange coupling magnetic field (Hex) between the antiferromagnetic layer 3 and the first pinned magnetic sublayer 4a.

The protective layer 7 may have a layered structure of a first protective sublayer 7a and a second protective sublayer 7b, as illustrated in FIG. 3. The insulating barrier layer 5 may be composed of a material other than Ti—Mg—O and Ti—O. In FIG. 3, while the average thickness T1 of the enhancement sublayer 12, the average thickness T2 of the first soft magnetic sublayer 13, and the total thickness T3 of T1 and T2 are preferably in the ranges described with reference to FIG. 2, these thicknesses are not limited to these ranges.

The layered structure of the free magnetic layer 6, the insulating barrier layer 5, and pinned magnetic layer 4, laminated in that order from the bottom, and the dual-type structure as illustrated in FIG. 5 may also be manufactured according to the method described with reference to FIGS. 6 to 9.

A tunneling magnetoresistive element according to the present invention can be used as a magnetoresistive random access memory (MRAM) and a magnetic sensor, as well as a magnetic head installed in hard disk drives.

EXAMPLE 1

A tunneling magnetoresistive element including a laminate 10 was fabricated. The laminate 10 included a free magnetic layer 6 including a first soft magnetic sublayer 13, a second soft magnetic sublayer 15, and a nonmagnetic metal sublayer 14 disposed there between, as illustrated in FIG. 2.

The laminate 10 included an underlying layer 1; Ta (30)/seed layer 2; $Ni_{49at\%}Fe_{12at\%}Cr_{39at\%}$ (50)/antiferromagnetic layer 3; $Ir_{26at\%}Mn_{74at\%}$ (70)/pinned magnetic layer 4 [first pinned magnetic sublayer 4a; $Fe_{30at\%}Co_{70at\%}$ (16)/nonmagnetic intermediate sublayer 4b; Ru (8.5)/second pinned magnetic sublayer 4c; $Co_{90at\%}Fe_{10at\%}$ (18)]/insulating barrier layer 5/free magnetic layer 6 [enhancement sublayer 12; $Fe_{90at\%}Co_{10at\%}$ (10)/first soft magnetic sublayer 13; $Ni_{88at\%}Fe_{12at\%}$ (X)/nonmagnetic metal sublayer 14; Ta (3)/second soft magnetic sublayer 15; $Ni_{88at\%}Fe_{12at\%}$ (20)]/first protective sublayer 7a; Ru (10)/second protective sublayer 7b; Ta (180), laminated in that order from the bottom.

The insulating barrier layer 5 was composed of Ti—Mg—O that was prepared by depositing Ti (4.6)/Mg (0.6) and oxidizing the Ti/Mg layer.

The values in parentheses are average thicknesses expressed in angstrom.

The laminate 10 was annealed at 270° C. for 3 hours 40 minutes.

A tunneling magnetoresistive element that included a laminate 10 having no enhancement sublayer 12 was also fabricated.

Figure 10:
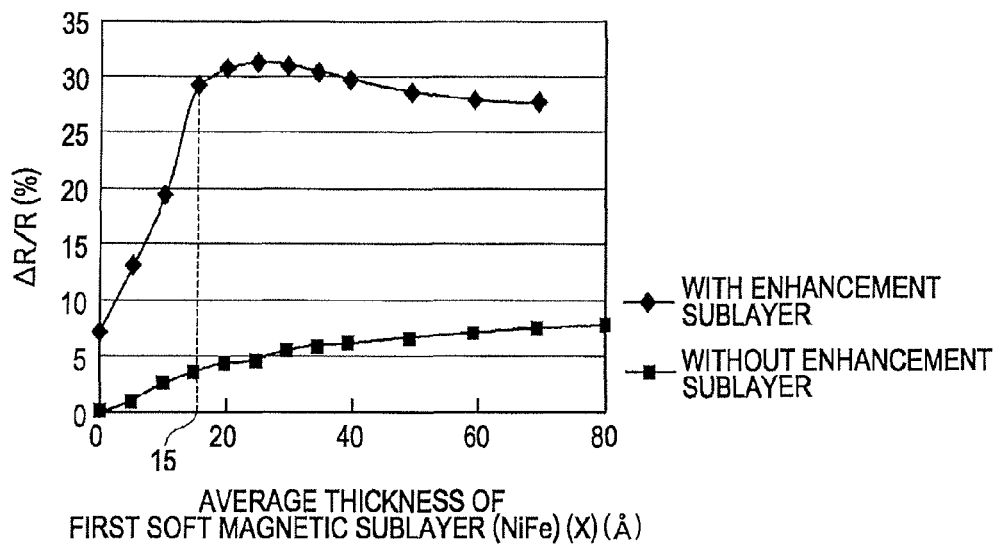
FIG. 10 is a graph showing the rate of resistance change ($\Delta R/R$) as a function of the average thickness (X) of a first soft magnetic sublayer in a tunneling magnetoresistive element with or without an enhancement sublayer, in which the tunneling magnetoresistive element includes a Ti—Mg—O insulating barrier layer and a free magnetic layer that includes the first soft magnetic sublayer, a second soft magnetic sublayer, and a Ta nonmagnetic metal sublayer disposed between the first and second soft magnetic sublayers.

The rate of resistance change (ΔR/R) was determined as a function of the average thickness of the first soft magnetic sublayer 13. FIG. 10 is a graph showing the rate of resistance change (ΔR/R) as a function of the average thickness (X) of the first soft magnetic sublayer 13.

As shown in FIG. 10, in the absence of the enhancement sublayer 12, the rate of resistance change (ΔR/R) did not increase significantly with increasing average thickness of the first soft magnetic sublayer 13.

By contrast, in the presence of the enhancement sublayer 12, the rate of resistance change (ΔR/R) increased sharply with increasing average thickness of the first soft magnetic sublayer 13 and leveled off at an average thickness of about 15 angstroms. The rate of resistance change (ΔR/R) remained high at an average thickness of the first soft magnetic sublayer 13 of 15 angstroms or more.

It was therefore found that, in the tunneling magnetoresistive element including the Ti—Mg—O insulating barrier layer 5, a high rate of resistance change (ΔR/R) can be achieved when the total thickness T3 of the average thickness T1 of the enhancement sublayer 12 (10 angstroms) and the average thickness T2 of the first soft magnetic sublayer 13 is 25 angstroms or more. Because the total thickness T3 corresponds to the distance between the insulating barrier layer 5 and the nonmagnetic metal sublayer 14, a high rate of resistance change (ΔR/R) can be achieved when the nonmagnetic metal sublayer 14 is placed away from the insulating barrier layer 5 by 25 angstroms or more.

Furthermore, in the presence of the enhancement sublayer 12, the rate of resistance change (ΔR/R) remained high at an average thickness T2 of the first soft magnetic sublayer 13 as large as 70 angstroms. Thus, the rate of resistance change (ΔR/R) remained high when the total thickness T3 of the average thickness T1 of the enhancement sublayer 12 and the average thickness T2 of the first soft magnetic sublayer 13 was 80 angstroms or less.

The results show that the average thickness T2 of the first soft magnetic sublayer 13 is preferably in the range of 15 to 70 angstroms in the tunneling magnetoresistive element including the Ti—Mg—O insulating barrier layer.

EXAMPLE 2

A tunneling magnetoresistive element including a laminate 10 was fabricated. The laminate 10 included a free magnetic layer 6 including a first soft magnetic sublayer 13, a second soft magnetic sublayer 15, and a nonmagnetic metal sublayer 14 disposed therebetween, as illustrated in FIG. 2.

The laminate 10 included an underlying layer 1; Ta (30)/seed layer 2; $Ni_{49at\%}Fe_{12at\%}Cr_{39at\%}$ (50)/antiferromagnetic layer 3; $Ir_{26at\%}Mn_{74at\%}$ (70)/pinned magnetic layer 4 [first pinned magnetic sublayer 4a; $Fe_{30at\%}Co_{70at\%}$ (16)/nonmagnetic intermediate sublayer 4b; Ru (8.5)/second pinned magnetic sublayer 4c; $Co_{90at\%}Fe_{10at\%}$ (18)]/insulating barrier layer 5/free magnetic layer 6 [enhancement sublayer 12; $Fe_{90at\%}Co_{10at\%}$ (Y)/first soft magnetic sublayer 13; $Ni_{88at\%}Fe_{12at\%}$ (20)/nonmagnetic metal sublayer 14; Ta (3)/second soft magnetic sublayer 15; $Ni_{88at\%}Fe_{12at\%}$ (40)]/first protective sublayer 7a; Ru (10)/second protective sublayer 7b; Ta (180), laminated in that order from the bottom The insulating barrier layer 5 was composed of Ti—Mg—O that was prepared by depositing Ti (4.6)/Mg (0.6) and oxidizing the Ti/Mg layer.

The values in parentheses are average thicknesses expressed in angstrom.

The laminate 10 was annealed at 270° C. for 3 hours 40 minutes.

Figure 11:
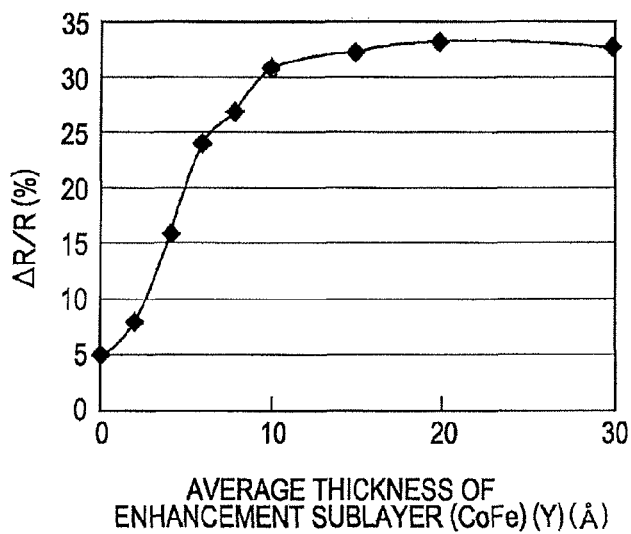
FIG. 11 is a graph showing the rate of resistance change ($\Delta R/R$) as a function of the average thickness (Y) of an enhancement sublayer in a tunneling magnetoresistive element that includes a Ti—Mg—O insulating barrier layer and a free magnetic layer including a first soft magnetic sublayer, a second soft magnetic sublayer, and a Ta nonmagnetic metal sublayer disposed between the first and second soft magnetic sublayers.

The rate of resistance change (ΔR/R) was determined as a function of the average thickness of the enhancement sublayer 12. FIG. 11 is a graph showing the rate of resistance change (ΔR/R) as a function of the average thickness (Y) of the enhancement sublayer 12.

The rate of resistance change (ΔR/R) increased sharply with increasing average thickness of the enhancement sublayer 12 and leveled off at an average thickness of 10 angstroms.

The result shows that the average thickness T1 of the enhancement sublayer 12 is preferably in the range of 10 to 30 angstroms in the tunneling magnetoresistive element including the Ti—Mg—O insulating barrier layer 5.

EXAMPLE 3

A tunneling magnetoresistive element including a laminate 10 was fabricated. The laminate 10 included a free magnetic layer 6 including a first soft magnetic sublayer 13, a second soft magnetic sublayer 15, and a nonmagnetic metal sublayer 14 disposed therebetween, as illustrated in FIG. 2.

The laminate 10 included an underlying layer 1; Ta (30)/seed layer 2; $Ni_{49at\%}Fe_{12at\%}Cr_{39at\%}$ (50)/antiferromagnetic layer 3; $Ir_{26at\%}Mn_{74at\%}$ (70)/pinned magnetic layer 4 [first pinned magnetic sublayer 4a; $Fe_{30at\%}Co_{70at\%}$ (16)/nonmagnetic intermediate sublayer 4b; Ru (8.5)/second pinned magnetic sublayer 4c; $Co_{90at\%}Fe_{10at\%}$ (18)]/insulating barrier layer 5/free magnetic layer 6 [enhancement sublayer 12; $Fe_{90at\%}Co_{10at\%}$ (10)/first soft magnetic sublayer 13; $Ni_{88at\%}Fe_{12at\%}$ (20)/nonmagnetic metal sublayer 14; Ta (Z)/second soft magnetic sublayer 15; $Ni_{88at\%}Fe_{12at\%}$ (40)]/first protective sublayer 7a; Ru (10)/second protective sublayer 7b; Ta (180), laminated in that order from the bottom The insulating barrier layer 5 was composed of Ti—Mg—O that was prepared by depositing Ti (4.6)/Mg (0.6) and oxidizing the Ti/Mg layer.

The values in parentheses are average thicknesses expressed in angstrom.

The laminate 10 was annealed at 270° C. for 3 hours 40 minutes.

Figure 12:
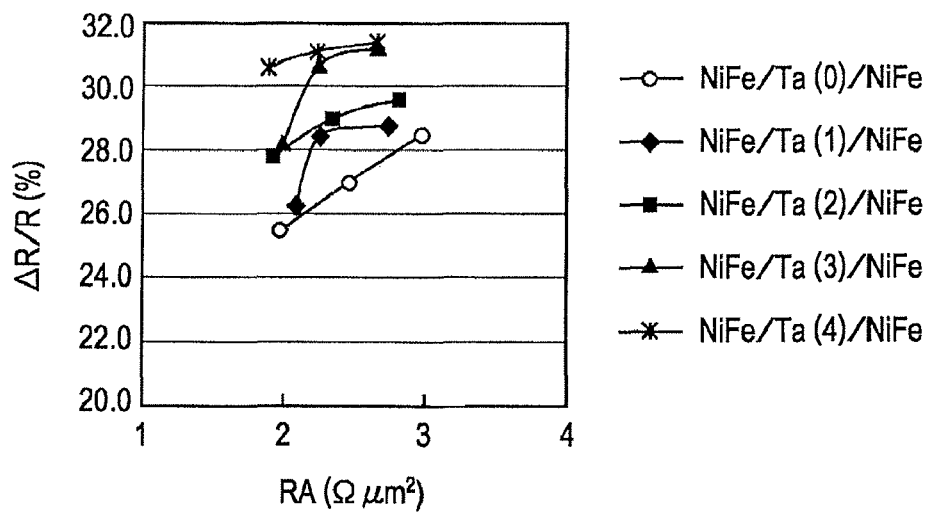
FIG. 12 is a graph showing the rate of resistance change ($\Delta R/R$) as a function of resistance-area (RA) product in a tunneling magnetoresistive element that includes a Ti—Mg—O insulating barrier layer and a free magnetic layer that includes a first soft magnetic sublayer, a second soft magnetic sublayer, and a Ta nonmagnetic metal sublayer disposed between the first and second soft magnetic sublayers and having a thickness of 0, 1, 2, 3, or 4 angstroms.

As shown in FIG. 12, the rate of resistance change (ΔR/R) was determined as a function of the resistance-area (RA) product for tunneling magnetoresistive elements that include nonmagnetic metal sublayers 14 having different average thicknesses (Z) of 0 (conventional example), 1, 2, 3, and 4 angstroms. The tunneling magnetoresistive elements that include the nonmagnetic metal sublayers 14 having the same average thickness and different resistance-area (RA) products were prepared by changing the oxidation time of the Ti/Mg layer in the insulating barrier layer 5 in the tunneling magnetoresistive elements that include the nonmagnetic metal sublayers 14 having the same average thickness.

FIG. 12 shows that the examples including the nonmagnetic metal sublayers 14 had rates of resistance change (ΔR/R) higher than that of the conventional example including no nonmagnetic metal sublayer 14, while the examples had substantially the same resistance-area (RA) products as the conventional example.

These results show that the average thickness of the nonmagnetic metal sublayer 14 was preferably in the range of one to four angstroms in the tunneling magnetoresistive element including the Ti—Mg—O insulating barrier layer 5.

EXAMPLE 4

A tunneling magnetoresistive element including a laminate 10 was fabricated. The laminate 10 included a free magnetic layer 6 including a first soft magnetic sublayer 13, a second soft magnetic sublayer 15, and a nonmagnetic metal sublayer 14 disposed therebetween, as illustrated in FIG. 2.

The laminate 10 included an underlying layer 1; Ta (30)/seed layer 2; $Ni_{49at\%}Fe_{12at\%}Cr_{39at\%}$ (50)/antiferromagnetic layer 3; $Ir_{26at\%}Mn_{74at\%}$ (70)/pinned magnetic layer 4 [first pinned magnetic sublayer 4a; $Fe_{30at\%}Co_{70at\%}$ (16)/nonmagnetic intermediate sublayer 4b; Ru (8.5)/second pinned magnetic sublayer 4c; $Co_{90at\%}Fe_{10at\%}$ (18)]/insulating barrier layer 5/free magnetic layer 6 [enhancement sublayer 12; $Fe_{90at\%}Co_{10at\%}$ (10)/first soft magnetic sublayer 13; $Ni_{88at\%}Fe_{12at\%}$ (X)/nonmagnetic metal sublayer 14; Ta (3)/second soft magnetic sublayer 15; $Ni_{88at\%}Fe_{12at\%}$ (20)]/first protective sublayer 7a; Ru (10)/second protective sublayer 7b; Ta (180), laminated in that order from the bottom.

The insulating barrier layer 5 was composed of Ti—O that is prepared by depositing Ti (5.2) on the second pinned magnetic sublayer 4c by sputtering and oxidizing the Ti layer.

The values in parentheses are average thicknesses expressed in angstrom.

The laminate was annealed at 270° C. for 3 hours 40 minutes.

A tunneling magnetoresistive element that included a laminate 10 having no enhancement sublayer 12 was also fabricated.

Figure 13:
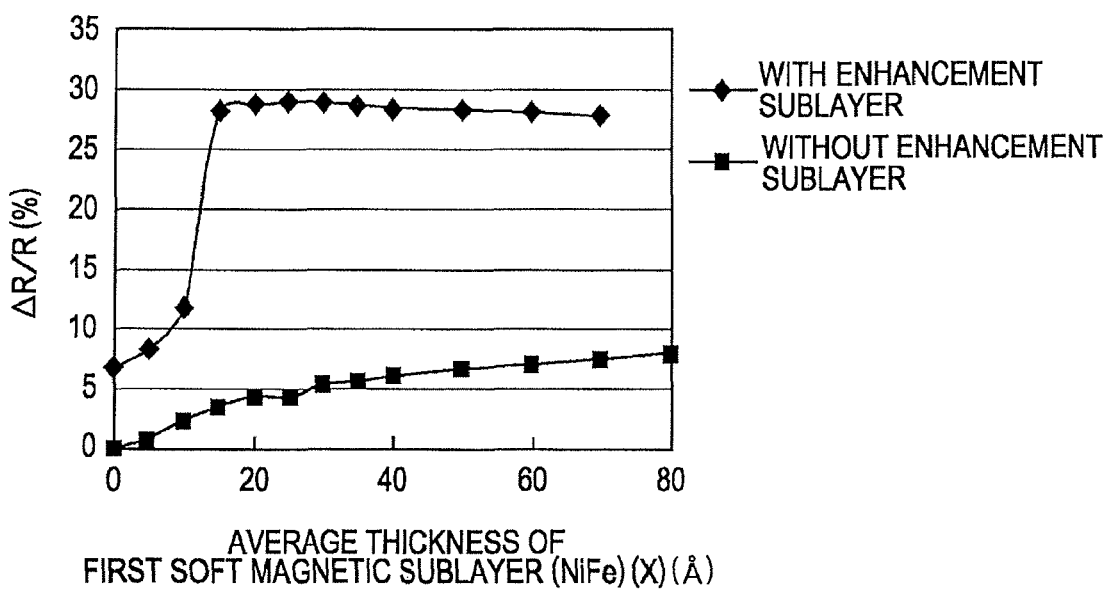
FIG. 13 is a graph showing the rate of resistance change ($\Delta R/R$) as a function of the average thickness (X) of a first soft magnetic sublayer in a tunneling magnetoresistive element with or without an enhancement sublayer, in which the tunneling magnetoresistive element includes a Ti—O insulating barrier layer and a free magnetic layer that includes the first soft magnetic sublayer, a second soft magnetic sublayer, and a Ta nonmagnetic metal sublayer disposed between the first and second soft magnetic sublayers.

The rate of resistance change (ΔR/R) was determined as a function of the average thickness of the first soft magnetic sublayer 13. FIG. 13 is a graph showing the rate of resistance change (ΔR/R) as a function of the average thickness (X) of the first soft magnetic sublayer 13.

As shown in FIG. 13, in the absence of the enhancement sublayer 12, the rate of resistance change (ΔR/R) did not increase significantly with increasing average thickness of the first soft magnetic sublayer 13.

By contrast, in the presence of the enhancement sublayer 12, the rate of resistance change (ΔR/R) increased sharply with increasing average thickness of the first soft magnetic sublayer 13 and leveled off at an average thickness of about 15 angstroms. The rate of resistance change (ΔR/R) remained high at an average thickness of the first soft magnetic sublayer 13 of 15 angstroms or more.

It was therefore found that, in the tunneling magnetoresistive element including the Ti—O insulating barrier layer 5, a high rate of resistance change (ΔR/R) can be achieved when the total thickness T3 of the average thickness T1 of the enhancement sublayer 12 (10 angstroms) and the average thickness T2 of the first soft magnetic sublayer 13 is 25 angstroms or more. Because the total thickness T3 corresponds to the distance between the insulating barrier layer 5 and the nonmagnetic metal sublayer 14, a high rate of resistance change (ΔR/R) can be achieved when the nonmagnetic metal sublayer 14 is placed away from the insulating barrier layer 5 by 25 angstroms or more.

Furthermore, in the presence of the enhancement sublayer 12, the rate of resistance change (ΔR/R) remained high at an average thickness T2 of the first soft magnetic sublayer 13 as large as 70 angstroms. Thus, the rate of resistance change (ΔR/R) remained high when the total thickness T3 of the average thickness T1 of the enhancement sublayer 12 and the average thickness T2 of the first soft magnetic sublayer 13 was 80 angstroms or less.

The results show that the average thickness T2 of the first soft magnetic sublayer 13 is preferably in the range of 15 to 70 angstroms in the tunneling magnetoresistive element including the Ti—O insulating barrier layer 5.

EXAMPLE 5

A tunneling magnetoresistive element including a laminate 10 was fabricated. The laminate 10 included a free magnetic layer 6 including a first soft magnetic sublayer 13, a second soft magnetic sublayer 15, and a nonmagnetic metal sublayer 14 disposed therebetween, as illustrated in FIG. 2.

The laminate 10 included an underlying layer 1; Ta (30)/seed layer 2; $Ni_{49at\%}Fe_{12at\%}Cr_{39at\%}$ (50)/antiferromagnetic layer 3; $Ir_{26at\%}Mn_{74at\%}$ (70)/pinned magnetic layer 4 [first pinned magnetic sublayer 4a; $Fe_{30at\%}Co_{70at\%}$ (16)/nonmagnetic intermediate sublayer 4b; Ru (8.5)/second pinned magnetic sublayer 4c; $Co_{90at\%}Fe_{10at\%}$ (18)]/insulating barrier layer 5/free magnetic layer 6 [enhancement sublayer 12; $Fe_{90at\%}Co_{10at\%}$ (Y)/first soft magnetic sublayer 13; $Ni_{88at\%}Fe_{12at\%}$ (20)/nonmagnetic metal sublayer 14; Ta (3)/second soft magnetic sublayer 15; $Ni_{88at\%}Fe_{12at\%}$ (40)]/first protective sublayer 7a; Ru (10)/second protective sublayer 7b; Ta (180), laminated in that order from the bottom.

The insulating barrier layer 5 was composed of Ti—O that is prepared by depositing Ti (5.2) on the second pinned magnetic sublayer 4c by sputtering and oxidizing the Ti layer.

The values in parentheses are average thicknesses expressed in angstrom.

The laminate 10 was annealed at 270° C. for 3 hours 40 minutes.

Figure 14:
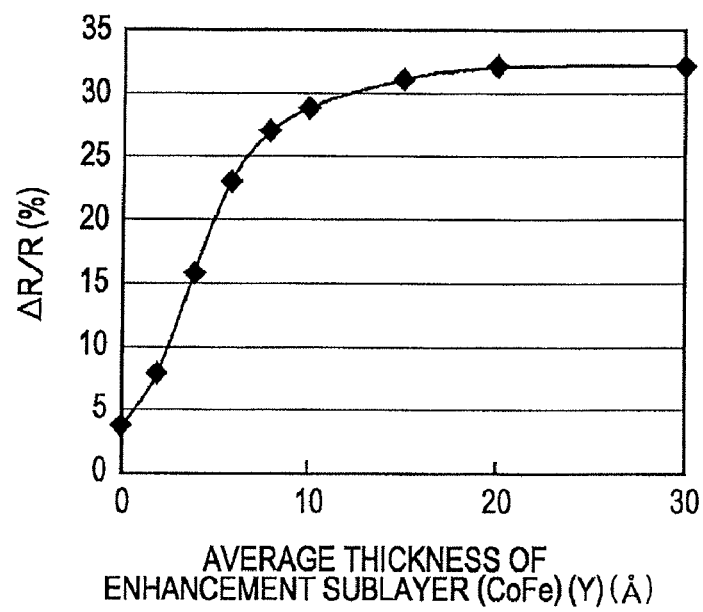
FIG. 14 is a graph showing the rate of resistance change ($\Delta R/R$) as a function of the average thickness (Y) of an enhancement sublayer in a tunneling magnetoresistive element that includes a Ti—O insulating barrier layer and a free magnetic layer including a first soft magnetic sublayer, a second soft magnetic sublayer, and a Ta nonmagnetic metal sublayer disposed between the first and second soft magnetic sublayers.

The rate of resistance change (ΔR/R) was determined as a function of the average thickness of the enhancement sublayer 12. FIG. 14 is a graph showing the rate of resistance change (ΔR/R) as a function of the average thickness (Y) of the enhancement sublayer 12.

The rate of resistance change (ΔR/R) increased sharply with increasing average thickness of the enhancement sublayer 12 and leveled off at an average thickness of 10 angstroms.

The result shows that the average thickness T1 of the enhancement sublayer 12 is preferably in the range of 10 to 30 angstroms in the tunneling magnetoresistive sensor including the Ti—O insulating barrier layer 5.

EXAMPLE 6

A tunneling magnetoresistive element including a laminate 10 was fabricated. The laminate 10 included a free magnetic layer 6 including a first soft magnetic sublayer 13, a second soft magnetic sublayer 15, and a nonmagnetic metal sublayer 14 disposed therebetween, as illustrated in FIG. 2.

The laminate 10 included an underlying layer 1; Ta (30)/seed layer 2; $Ni_{49at\%}Fe_{12at\%}Cr_{39at\%}$ (50)/antiferromagnetic layer 3; $Ir_{26at\%}Mn_{74at\%}$ (70)/pinned magnetic layer 4 [first pinned magnetic sublayer 4a; $Fe_{30at\%}Co_{70at\%}$ (16)/nonmagnetic intermediate sublayer 4b; Ru (8.5)/second pinned magnetic sublayer 4c; $Co_{90at\%}Fe_{10at\%}$ (18)]/insulating barrier layer 5/free magnetic layer 6 [enhancement sublayer 12; $Fe_{90at\%}Co_{10at\%}$ (10)/first soft magnetic sublayer 13; $Ni_{88at\%}Fe_{12at\%}$ (20)/nonmagnetic metal sublayer 14; Ta (Z)/second soft magnetic sublayer 15; $Ni_{88at\%}Fe_{12at\%}$ (40)]/first protective sublayer 7a; Ru (10)/second protective sublayer 7b; Ta (180), laminated in that order from the bottom.

The insulating barrier layer 5 was composed of Ti—O that is prepared by depositing Ti (4.6) on the second pinned magnetic sublayer 4c by sputtering and oxidizing the Ti layer.

The values in parentheses are average thicknesses expressed in angstrom.

The laminate 10 was annealed at 270° C. for 3 hours 40 minutes.

Figure 15:
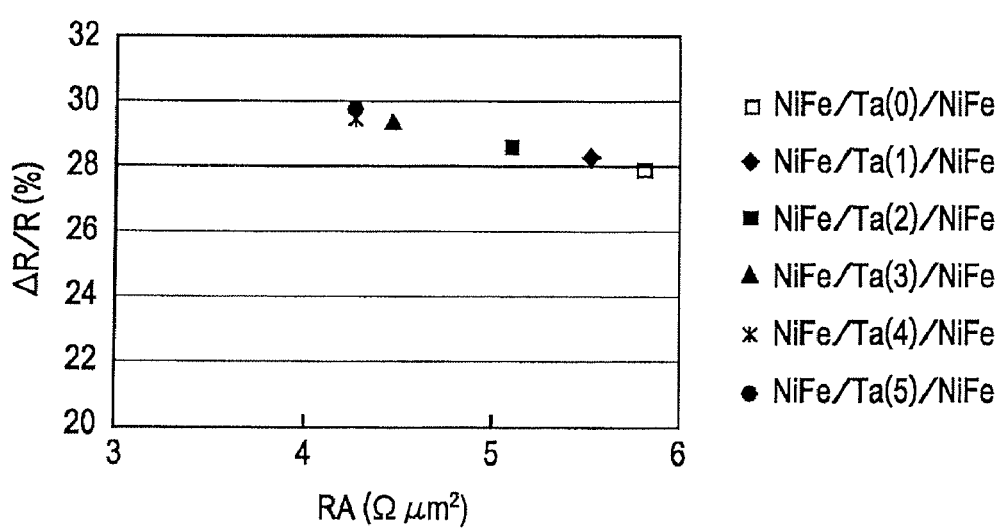
FIG. 15 is a graph showing the rate of resistance change ($\Delta R/R$) as a function of resistance-area (RA) product in a tunneling magnetoresistive element that includes a Ti—O insulating barrier layer and a free magnetic layer that includes a first soft magnetic sublayer, a second soft magnetic sublayer, and a Ta nonmagnetic metal sublayer disposed between the first and second soft magnetic sublayers and having a thickness of 0, 1, 2, 3, 4, or 5 angstroms.

As shown in FIG. 15, the rate of resistance change ($\Delta R/R$) was determined as a function of the resistance-area (RA) product for tunneling magnetoresistive elements that include nonmagnetic metal sublayers 14 having different average thicknesses (Z) of 0 (conventional example), 1, 2, 3, 4, and 5 angstroms. The oxidation time of the Ti layer in the insulating barrier layer 5 was fixed at a predetermined time for the tunneling magnetoresistive elements that include nonmagnetic metal sublayers 14 having different average thicknesses.

FIG. 15 shows that the examples including the nonmagnetic metal sublayers 14 had rates of resistance change ($\Delta R/R$) higher than that of the conventional example including no nonmagnetic metal sublayer 14. While the resistance-area (RA) products of the examples were smaller than that of the conventional example, the differences in the resistance-area (RA) product were not significantly large. The differences may therefore be compensated, for example, by changing the oxidation time of the Ti layer.

When the average thickness of the nonmagnetic metal sublayer 14 (Z) was five angstroms, the rate of resistance change ($\Delta R/R$) was advantageously high, but variations in asymmetry of reproduced waveform increased and therefore the read characteristics became unstable, because the magnetic coupling between the first soft magnetic sublayer 13 and the second soft magnetic sublayer 15 was interrupted.

These results show that the average thickness of the nonmagnetic metal sublayer 14 was preferably in the range of one to four angstroms in the tunneling magnetoresistive element including the Ti—O insulating barrier layer 5.

EXAMPLE 7

A tunneling magnetoresistive element including a laminate 10 was fabricated. The laminate 10 included a first protective sublayer 7a and a second protective sublayer 7b on a free magnetic layer 6, as illustrated in FIG. 3.

The laminate 10 included an underlying layer 1; Ta (30)/ seed layer 2; $Ni_{49at\%}Fe_{12at\%}Cr_{39at\%}$ (50)/antiferromagnetic layer 3; $Ir_{26at\%}Mn_{74at\%}$ (70)/pinned magnetic layer 4 [first pinned magnetic sublayer 4a; $Fe_{30at\%}Co_{70at\%}$ (16)/nonmagnetic intermediate sublayer 4b; Ru (8.5)/second pinned magnetic sublayer 4c; $Co_{90at\%}Fe_{10at\%}$ (18)]/insulating barrier layer 5/free magnetic layer 6 [enhancement sublayer 12; $Fe_{90at\%}Co_{10at\%}$ (10)/first soft magnetic sublayer 13; $Ni_{88at\%}Fe_{12at\%}$ (20)/nonmagnetic metal sublayer 14; Ta (3)/second soft magnetic sublayer 15; $Ni_{88at\%}Fe_{12at\%}$ (40)]/first protective sublayer 7a; Ru (10)/second protective sublayer 7b; Ta (180), laminated in that order from the bottom The insulating barrier layer 5 was composed of Ti—Mg—O that was prepared by depositing Ti (4.6)/Mg (0.6) and oxidizing the Ti/Mg layer.

The values in parentheses are average thicknesses expressed in angstrom.

The laminate 10 was annealed at 270° C. for 3 hours 40 minutes.

Figure 16:
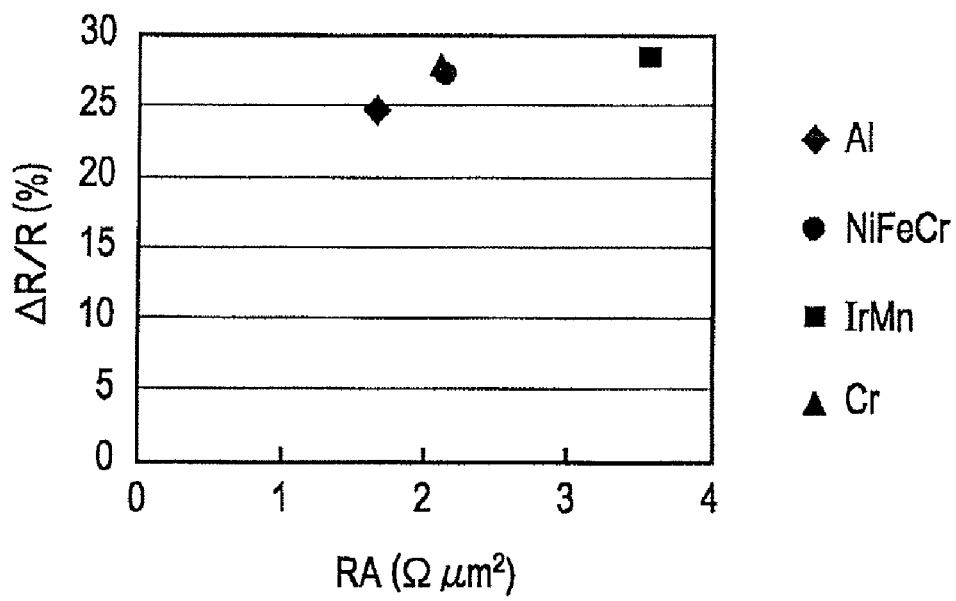
FIG. 16 is a graph showing the rate of resistance change ($\Delta R/R$) as a function of resistance-area (RA) product in a tunneling magnetoresistive element that includes a first protective sublayer composed of Al, Ni—Fe—Cr, Ir—Mn, or Cr and a free magnetic layer that includes a first soft magnetic sublayer, a second soft magnetic sublayer, and a Ta nonmagnetic metal sublayer disposed between the first and second soft magnetic sublayers (working example)

As shown in FIG. 16, the rate of resistance change ($\Delta R/R$) was determined as a function of resistance-area (RA) product for tunneling magnetoresistive elements that include a first protective sublayer 7a composed of Al, $Ni_{49at\%}Fe_{12at\%}Cr_{39at\%}$, $Ir_{26at\%}Mn_{74at\%}$, or Cr.

COMPARATIVE EXAMPLE 1

Figure 17:
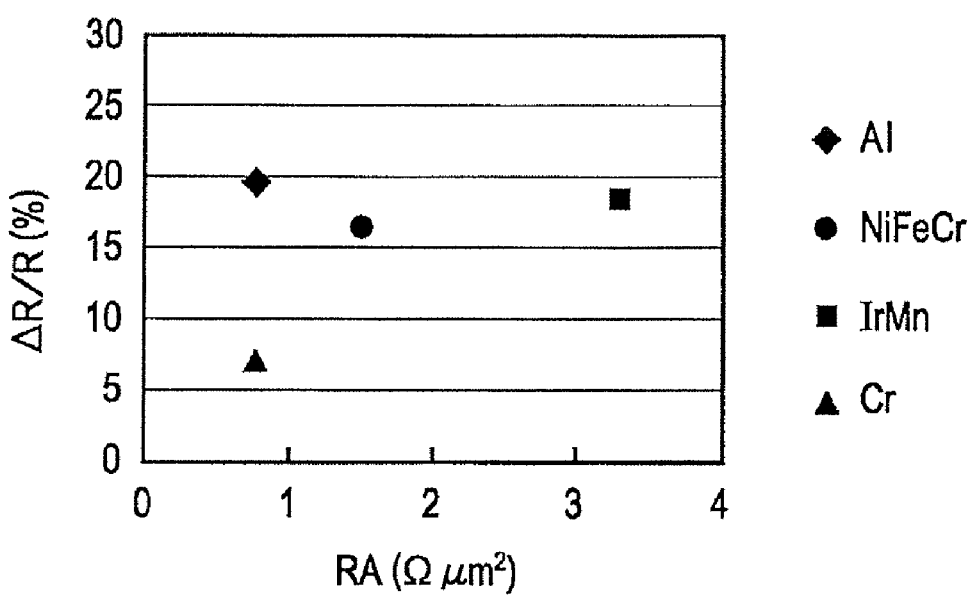
FIG. 17 is a graph showing the rate of resistance change ($\Delta R/R$) as a function of resistance-area (RA) product in a tunneling magnetoresistive element that includes a first protective sublayer composed of Al, Ni—Fe—Cr, Ir—Mn, or Cr and a free magnetic layer that includes a first soft magnetic sublayer, a second soft magnetic sublayer, and no Ta nonmagnetic metal sublayer disposed between the first and second soft magnetic sublayers (comparative example).

As shown in FIG. 17, the rate of resistance change ($\Delta R/R$) was determined as a function of resistance-area (RA) product for tunneling magnetoresistive elements that include a first protective sublayer 7a composed of Al, $Ni_{49at\%}Fe_{12at\%}Cr_{39at\%}$, $Ir_{26at\%}Mn_{74at\%}$, or Cr and the same laminate as that described in Example 3 except that the nonmagnetic metal sublayer 14 was eliminated As is evident from comparison between FIG. 16 and FIG. 17, while the examples and the comparative examples have almost the same resistance-area (RA) product, the examples had rates of resistance change ($\Delta R/R$) higher than those of the comparative examples. The tunneling magnetoresistive elements having different first protective sublayers 7a had substantially the same rate of resistance change ($\Delta R/R$), as shown in FIG. 16.

Thus, in the tunneling magnetoresistive elements including the nonmagnetic metal sublayer 14 in the free magnetic layer 6, any of various candidate materials may be used for the first protective sublayer 7a.

The invention claimed is:

1. A tunneling magnetoresistive element comprising: a laminate that includes a pinned magnetic layer having a fixed magnetization direction, an insulating barrier layer, and a free magnetic layer having a variable magnetization direction according to an external magnetic field, laminated in that order from the bottom, wherein the free magnetic layer includes a plurality of soft magnetic sublayers, a nonmagnetic metal sublayer separating the soft magnetic sublayers, and an enhancement sublayer disposed between a first soft magnetic sublayer and the insulating barrier layer and having a spin polarizability higher than those of the soft magnetic sublayers, the first soft magnetic sublayer being the soft magnetic sublayer closest to the insulating barrier layer, the soft magnetic sublayers are magnetically coupled to each other and thereby have the same magnetization direction, and the laminate further includes a protective layer, as a top layer, that includes a first protective sublayer as a bottom sublayer and that is composed of at least one selected from the group consisting of Ru, Al, Ni—Fe—Cr, Ir—Mn, and Cr,
wherein the first soft magnetic sublayer has an average thickness in a range from 15 to 70 angstrom, the enhancement sublayer has an average thickness in a range from 10 to 30 angstrom, and a total thickness of the average thickness of the enhancement sublayer and the average thickness of the first soft magnetic layer is 80 angstrom or less.

2. The tunneling magnetoresistive element according to claim 1, wherein the protective layer further includes a second protective sublayer disposed on the first protective sublayer and composed of Ta.

3. The tunneling magnetoresistive element according to claim 1, wherein the nonmagnetic metal sublayer is composed of at least one selected from the group consisting of Ti, V, Zr, Nb, Mo, Hf, Ta, and W.

4. The tunneling magnetoresistive element according to claim 3, wherein the nonmagnetic metal sublayer is composed of Ta.

5. The tunneling magnetoresistive element according to claim 1, wherein the average thickness of the nonmagnetic metal sublayer is in the range of one to four angstroms.

6. The tunneling magnetoresistive element according to claim 1, wherein the soft magnetic sublayers are formed of a Ni—Fe alloy, and the enhancement sublayer is formed of a Co—Fe alloy.

* * * * *

UNITED STATES PATENT AND TRADEMARK OFFICE
CERTIFICATE OF CORRECTION

PATENT NO. : 8,054,588 B2  
APPLICATION NO. : 13/025842  
DATED : November 8, 2011  
INVENTOR(S) : Kazumasa Nishimura et al.

Page 1 of 1

It is certified that error appears in the above-identified patent and that said Letters Patent is hereby corrected as shown below:

On the Title Page

Left column, item (75), replace "Hasahiko Ishizone" with --Masahiko Ishizone--.

Signed and Sealed this  
Sixth Day of March, 2012

David J. Kappos  
*Director of the United States Patent and Trademark Office*